United States Patent
Mori et al.

(10) Patent No.: US 10,128,825 B2
(45) Date of Patent: Nov. 13, 2018

(54) RINGING SUPPRESSION CIRCUIT

(71) Applicants: DENSO CORPORATION, Kariya, Aichi-pref. (JP); SOKEN, INC., Nishio, Aichi-pref. (JP)

(72) Inventors: Hiroyuki Mori, Nishio (JP); Takuya Honda, Kariya (JP); Tomohisa Kishigami, Kariya (JP); Hirofumi Isomura, Kariya (JP)

(73) Assignees: DENSO CORPORATION, Kariya (JP); SOKEN, INC., Nishio (JP)

( * ) Notice: Subject to any disclaimer, the term of this patent is extended or adjusted under 35 U.S.C. 154(b) by 0 days.

(21) Appl. No.: 15/753,596

(22) PCT Filed: Aug. 25, 2016

(86) PCT No.: PCT/JP2016/074725
§ 371 (c)(1),
(2) Date: Feb. 20, 2018

(87) PCT Pub. No.: WO2017/038592
PCT Pub. Date: Mar. 9, 2017

(65) Prior Publication Data
US 2018/0248542 A1 Aug. 30, 2018

(30) Foreign Application Priority Data

Sep. 1, 2015 (JP) .................................. 2015-171942
Apr. 19, 2016 (JP) .................................. 2016-083699

(51) Int. Cl.
*H03K 5/08* (2006.01)
*H03K 5/1252* (2006.01)
(Continued)

(52) U.S. Cl.
CPC ......... *H03K 5/1252* (2013.01); *H03K 17/687* (2013.01); *H04B 3/42* (2013.01)

(58) Field of Classification Search
CPC ......................... H03K 5/08; H03K 19/00315; H01L 27/0266; H01L 27/0251; H01L 27/0285
(Continued)

(56) References Cited

U.S. PATENT DOCUMENTS 9,413,566 B2 * 8/2016 Mori .................... H04L 25/0292
10,020,841 B2 * 7/2018 De Haas ............... H03K 5/1534
(Continued)

FOREIGN PATENT DOCUMENTS

JP   2003-008423 A   1/2003
JP   2009-253498 A   10/2009
(Continued)

*Primary Examiner* — Quan Tra
(74) *Attorney, Agent, or Firm* — Posz Law Group, PLC

(57) ABSTRACT

A ringing suppression circuit includes: a single line switching element, which is driven by a voltage, that is connected between a pair of signal lines; a controller that detects a change in a level of the differential signal and turns on the single line switching element to lower an impedance between the pair of signal lines; a period detector that detects a length of a suppressing period indicated by a setting signal, which is an input; and a suppressing period storage that stores the length of the suppressing period which is detected by the period detector. In addition, the pair of signal lines includes a high potential signal line and a low potential signal line. Moreover, the controller turns on the single line switching element for only the suppressing period having the length, which is stored in the suppressing period storage.

11 Claims, 19 Drawing Sheets

(51) Int. Cl.
*H04B 3/42* (2006.01)
*H03K 17/687* (2006.01)

(58) Field of Classification Search
USPC .......................................................... 327/313
See application file for complete search history.

(56) References Cited

U.S. PATENT DOCUMENTS

2011/0169547 A1* 7/2011 Suzuki ............. H03K 19/00361
327/384
2012/0293230 A1 11/2012 Mori et al.

FOREIGN PATENT DOCUMENTS

WO 2017/051490 A1 3/2017
WO 2017/051654 A1 3/2017

* cited by examiner

| T1,T2,...Tn | SWr1 | SWr2 | ... | SWrn | SWc1 | SWc2 | ... | SWcn |
|---|---|---|---|---|---|---|---|---|
| 00...0 | OFF | OFF | ... | OFF | OFF | OFF | ... | OFF |
| 10...0 | ON | OFF | ... | OFF | ON | OFF | ... | OFF |
| ... | | | | | | | | |
| 11...1 | ON | ON | ... | ON | ON | ON | ... | ON |

| T1,T2,···Tn+1 | SWr0 | SWr1 | ··· | SWrn | SWc0 | SWc1 | ··· | SWcn |
|---|---|---|---|---|---|---|---|---|
| 00···0 | ON | OFF | ··· | OFF | ON | OFF | ··· | OFF |
| 10···0 | OFF | ON | ··· | OFF | OFF | ON | ··· | OFF |
| ··· | | | | | | | | |
| 11···1 | OFF | OFF | ··· | ON | OFF | OFF | ··· | ON |

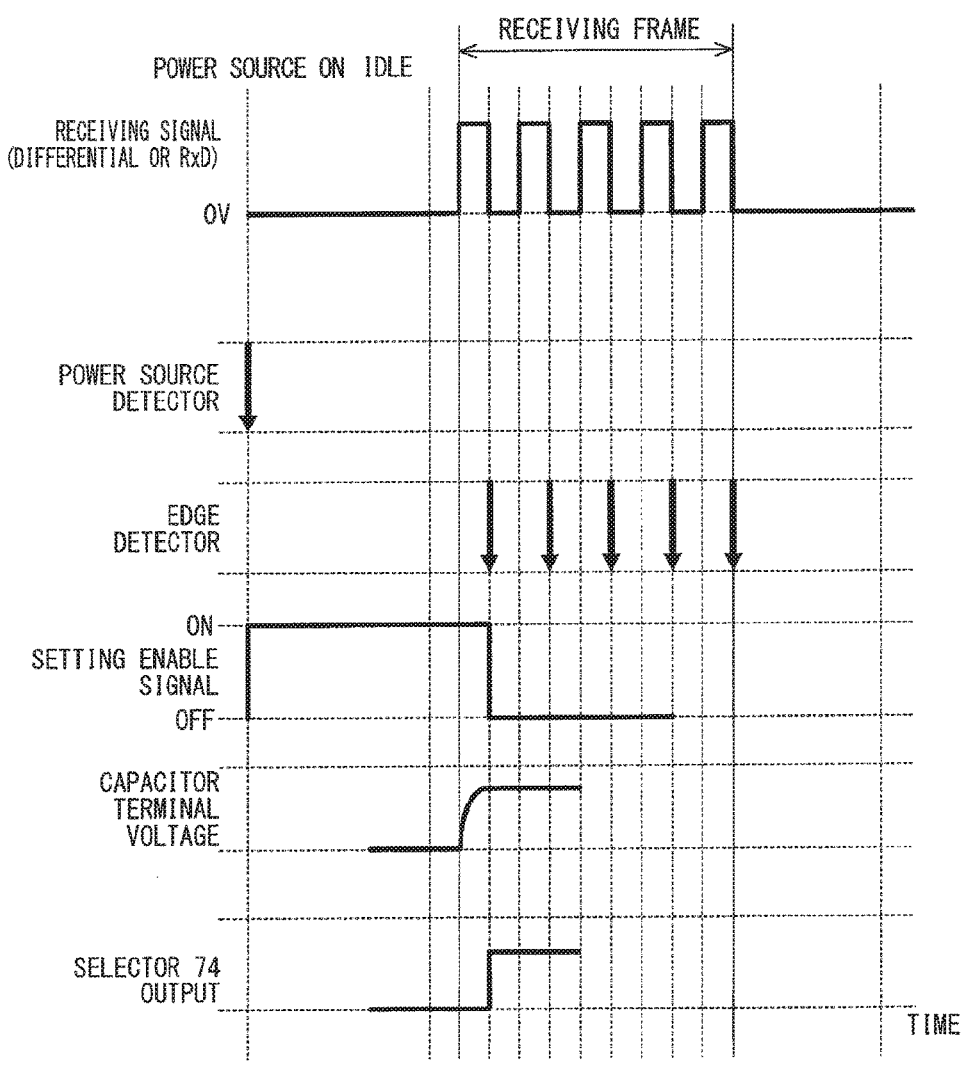

RINGING SUPPRESSION CIRCUIT

CROSS REFERENCE TO RELATED APPLICATIONS

This application is a U.S. national phase of International Application No. PCT/JP2016/074725 filed on Aug. 25, 2016 and is based on Japanese Patent Application No. 2015-171942 filed on Sep. 1, 2015 and Japanese Patent Application No. 2016-83699 filed on Apr. 19, 2016, the disclosures of which are incorporated herein by reference.

TECHNICAL FIELD

The present disclosure relates to a circuit that is connected to a transmission line for transmitting a differential signal generated by a pair of a high potential level signal line and a low potential level signal line to suppress ringing occurred in the transmission of the signal.

BACKGROUND ART

When a digital signal is transmitted through a transmission line, at a signal receiving side, waveform distortion such as overshoot or undershoot, in other words, ringing, occurs when a portion of signal energy is reflected at the timing when a signal level changes. Thus, several proposals have been made for suppressing waveform distortion. For example, Patent Literature 1 discloses that, when the voltage level of the transmission line is changed between a high level and a low level, the impedance is set to be consistent in a predetermined period in which the communication is not affected to suppress ringing.

However, in Patent Literature 1, the period for making the impedance to be consistent is fixed. Accordingly, in a situation where an actual communication speed is lower than an expected speed, there is less advantageous effect in suppressing ringing. In addition, in a situation where the actual communication speed is faster than the expected speed, a communication signal cannot be normally received. In order to avoid such situation, it is required to design a product corresponding to an individual speed. However, an increase in number of components or cost is expected.

PRIOR ART LITERATURES

Patent Literature

Patent Literature 1: JP 5498527 B

SUMMARY OF INVENTION

It is an object of the present disclosure to provide a ringing suppression circuit that optimally suppresses ringing correspondingly to a variety of communication speeds.

A ringing suppression circuit according to an aspect of the present disclosure connects to a transmission line for transmitting a differential signal changed into a high level or a low level as one of binary levels through a pair of signal lines to suppress ringing occurred with a transmission of the differential signal. The ringing suppression circuit includes: a single line switching element, which is driven by a voltage, that is connected between the pair of signal lines; a controller that detects a change in a level of the differential signal and turns on the single line switching element to lower an impedance between the pair of signal lines; a period detector that detects a length of a suppressing period indicated by a setting signal, which is an input; and a suppressing period storage that stores the length of the suppressing period which is detected by the period detector. In addition, the pair of signal lines includes a high potential signal line and a low potential signal line. Moreover, the controller turns on the single line switching element for only the suppressing period having the length, which is stored in the suppressing period storage.

According to the configuration described above, the length of suppressing period according to a communication speed of a differential signal is determined, and a setting signal corresponding to the length is sent and the length of suppressing period is stored in the suppressing period storage. Accordingly, the controller can variably set the period to control a line switching element to be at an on state. Therefore, it is possible to suppress ringing according to the communication speed optimally.

BRIEF DESCRIPTION OF DRAWINGS

The above and other objects, features and advantages of the present disclosure will become more apparent from the following detailed description made with reference to the accompanying drawings. In the drawings:

FIG. 22 illustrates an operational timing chart.

EMBODIMENTS FOR CARRYING OUT INVENTION (First Embodiment)

Figure 1:
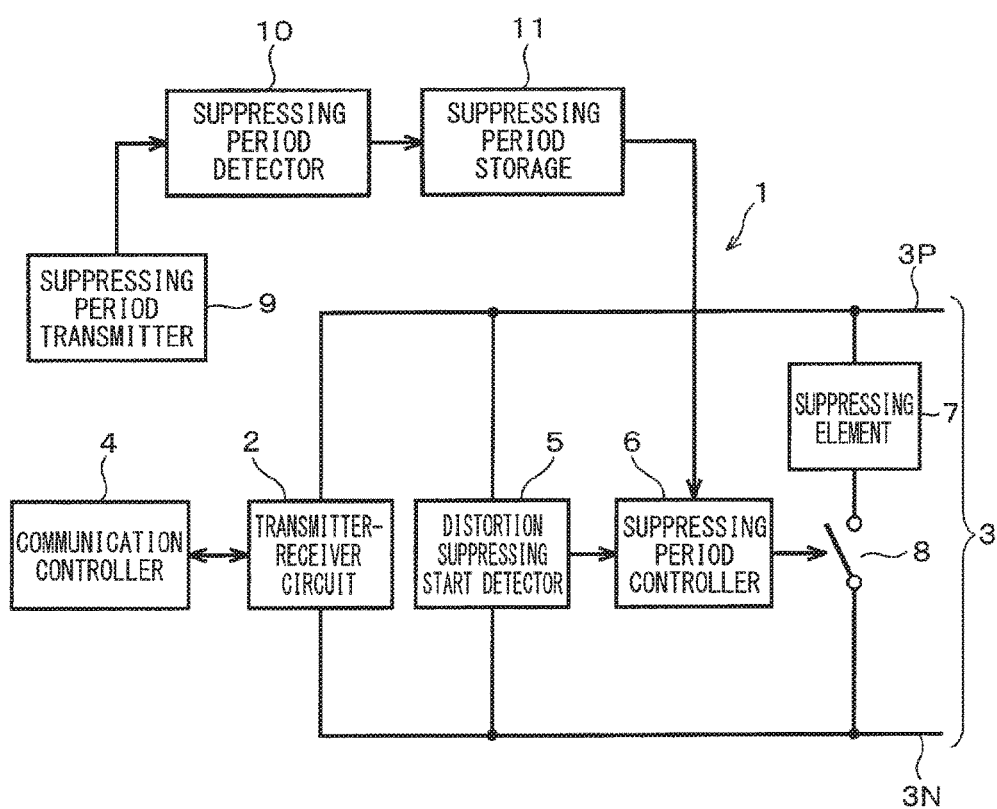
FIG. 1 illustrates a functional block diagram that shows a configuration of a ringing suppression circuit according to first embodiment.

The following describes a first embodiment. As shown in FIG. 1, a ringing suppression circuit 1 is connected to a transmitter-receiver circuit 2 in parallel between a transmission line 3 including a high potential signal line 3P and a low potential signal line 3N. It is noted that a transmitter circuit or a receiver circuit may replace the transmitter-receiver circuit 2. The transmitter-receiver circuit 2 is controlled by a communication controller 4 to send a differential signal for driving the transmission lines 3, or inputs receiving date to the communication controller 4 when the differential signal transmitted from another transmission node through the transmission lines 3 is received.

A distortion suppressing start detector 5 detects a change in a voltage of the transmission line when a differential signal is transmitted, and sends a trigger signal for starting a suppressing operation on distortion and ringing. A series circuit having a suppressing element 7 and a switching circuit 8 is connected between signal lines 3P and 3N. When the suppressing period controller 6 receives the trigger signal, the suppressing period controller 6 lowers the impedance of the transmission line 3 by turning on the switching circuit 8 in only a suppressing period, which is previously set.

In the present embodiment, it is possible to change the setting of the length of the suppressing period. Accordingly, the suppressing period transmitter 9 transmits a setting signal for setting the length of suppressing period at the suppressing period controller 6. When a setting signal is received by a suppressing period detector 10 and is detected, the setting signal is stored into the suppressing period storage 11. Subsequently, the suppressing period controller 6 turns on the switching circuit 8 for only a suppressing period with the time length stored in the suppressing period storage 11.

Figure 2:
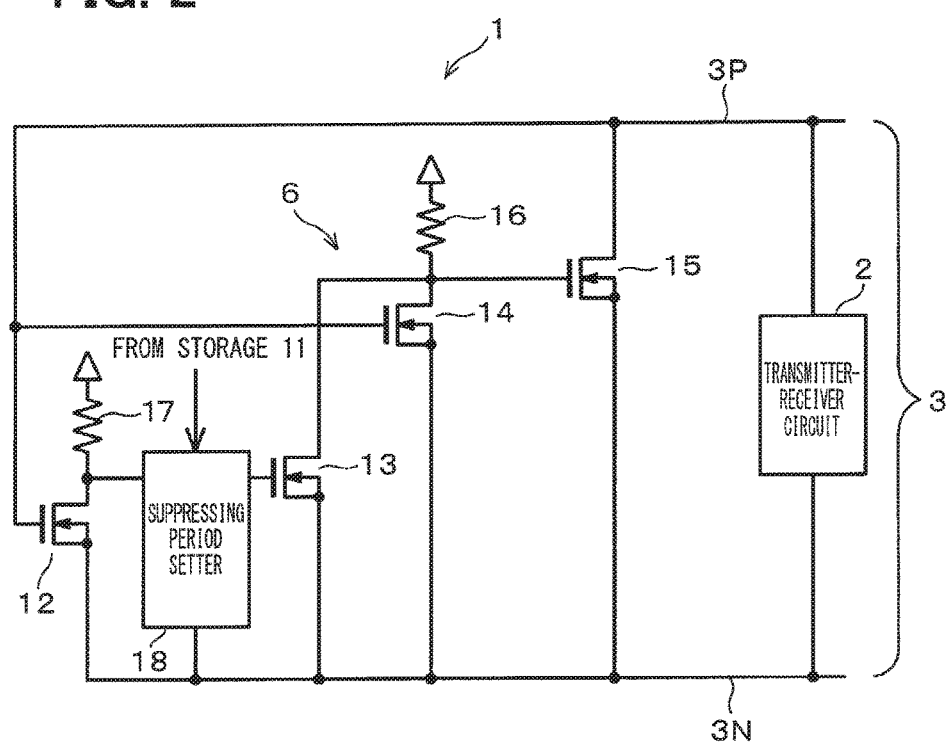
FIG. 2 illustrates one part of the ringing circuit as a particular circuit.

In FIG. 2 showing a particular configuration, the source as the potential reference conduction terminal of each of four N-channel MOSFETs 12 to 15 is connected to the low potential signal line 3N. The gate as the control terminal of each of the N-channel MOSFETs 12 and 14 is connected to the high potential signal line 3P.

The drain as the non-reference conduction terminal of the FET 15, which is a line switching element, is connected to the high potential signal line 3P. The drain of each of the FETs 13 and 14 is connected to the gate of the FET 7 and is pulled up to a high-level (that is, a power source level Vcc) through a resistive element 16. The drain of the FET 12 is pulled up to the high-level through a resistive element 17, and is connected to the gate of the FET 13 through a suppressing period setter 18. In view of above, the FET 15 corresponds to the series circuit having the suppressing element 7 and the switching circuit 8 illustrated in FIG. 1. In other words, the on-resistance of the FET 15 corresponds to the suppressing element 7. In addition, the FET 12 corresponds to the distortion suppressing start detector. Other FETs correspond to a suppressing period controller 6.

Figure 3:
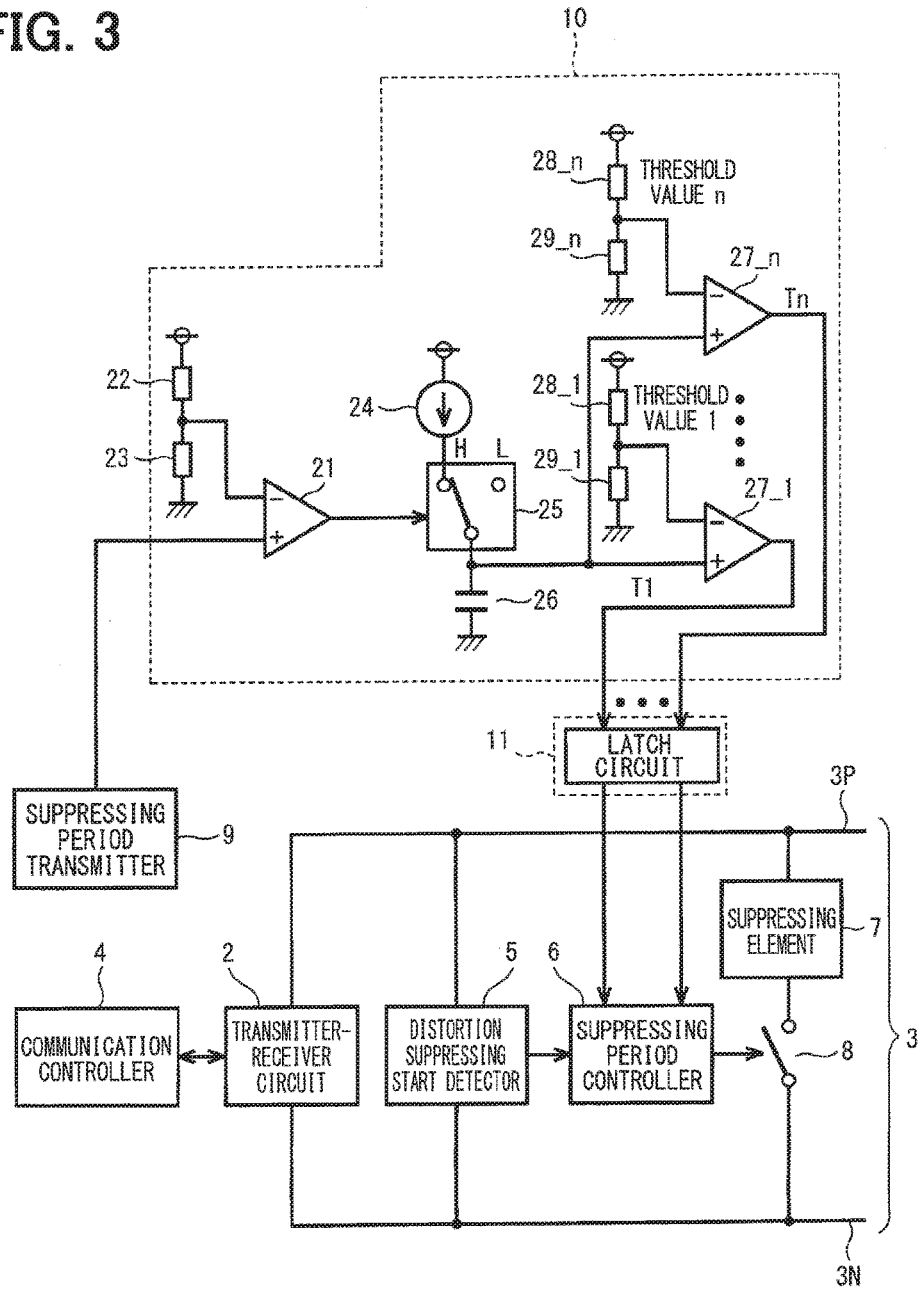
FIG. 3 illustrates a configuration related to a suppressing period detector and a configuration related to a suppressing period storage in detail.

As shown in FIG. 3, a suppressing period detector 10 includes a comparator 21. The transmission signal sent from the suppressing period transmitter 9 is inputted to the non-inverting input terminal of the comparator 21. A series circuit including resistive elements 22 and 23 is connected between a power source and ground, and the common connection point of these resistive elements 22 and 23 is connected to the inverting input terminal of the comparator 21.

A series circuit including a current source 24, a selector 25 and a capacitor 26 is connected between the power source and the ground. The current source 24 and the selector 25 correspond to a charger. The lower terminal of the current source 24 is connected to an H-side input terminal of the selector 25, and the output terminal of the selector 25 is connected to the upper terminal of the capacitor 26. An L-side input terminal of the selector 25 is at an open state. The input selection performed by the selector 25 is controlled by an output signal of the comparator 21. That is, H/L side input terminal is selected according to a change in a binary level of the output signal.

Moreover, the suppressing period detector 10 includes, for example, n comparators 21_1 to 27_n. The non-inverting input terminals of the respective compactors are connected to the output terminal of the selector 25. A series circuit including resistive elements 28_1 to 28_n and resistive elements 29_1 to 29_n, which is similar to the comparator 21, is provided correspondingly to each of the comparators 27_1 to 27_n. The common connection points are connected to the respective inverting input terminals of the comparators 27_1 to 27_n. The respective threshold values 1 to n are given by the corresponding potential level of the common connection points. The threshold value 1 represents a lowest level, and the threshold value n represents a highest level. The threshold values between the threshold value 1 and the threshold value n are set to be consecutive levels in an ascending order. The output signals T1 to Tn from the comparators 27_1 to 27_n are sent to the suppressing period controller 6 through the suppressing period storage 11 configured by a latch circuit.

Figures 5, 6:
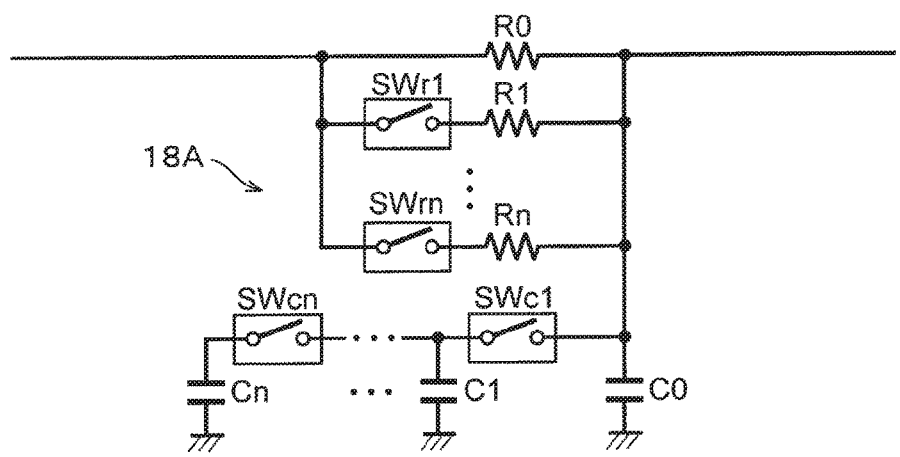
FIG. 5 illustrates a particular configuration example of the suppressing period setter (part 1)
FIG. 6 illustrates signals T1 to Tn and an on-off state of each switch.
Figures 7, 8:
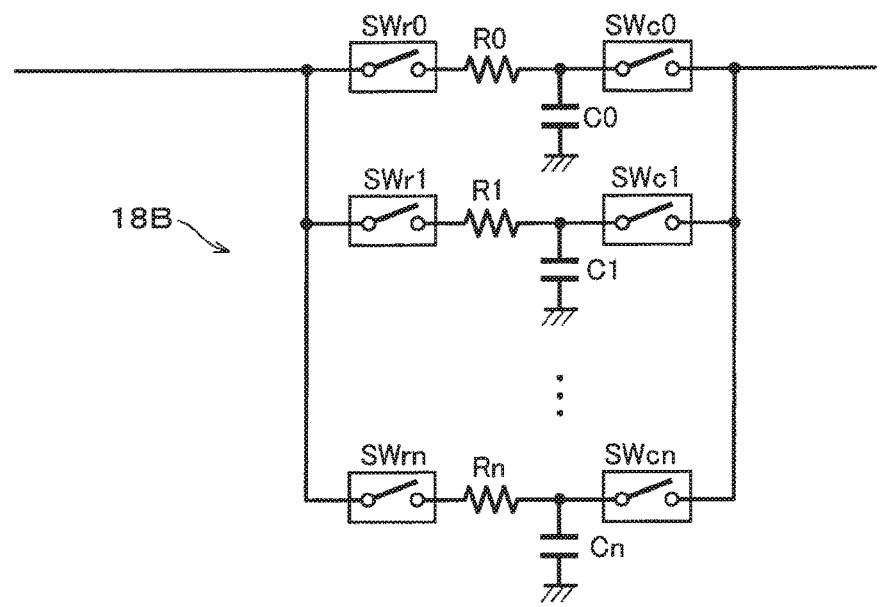
FIG. 7 illustrates a particular configuration example of the suppressing period setter (part 2)
FIG. 8 illustrates signals T1 to Tn+1 and an the on-off state of each switch.

The suppressing period setter 18 illustrated in FIG. 2 is configured by an integrator circuit capable of changing a time constant, that is, a delay circuit as illustrated in FIG. 5 or FIG. 7. A suppressing period setter 18A illustrated in FIG. 5 includes resistive elements R0 to Rn, capacitors C0 to Cn, switches SWr1 to SWm and Swc1 to SWcn. Each of series circuits having the switch SWr1 and the resistive element R1 ... and the switch SWrn and the resistive Rn is connected parallel to the resistive element R0.

The common connection point of the respective resistive elements R0 to Rn is connected to the ground through the capacitor C0. The lower terminals of other capacitors C1 to Cn are connected through the switch SWc1 . . . the upper terminals of the capacitors Cn-1, Cn are connected through the switch SWcn. The on-off states of the respective switches SWr1, SWc1 to SWm and SWcn are controlled by signals T1 to Tn respectively from the suppressing period storage 11.

The suppressing period setter 18B shown in FIG. 7 includes the switches SWr0 and SWc0 in addition to the suppressing period setter 18A. The resistive element R0 and capacitor C0 . . . and the resistive element Rn and the capacitor Cn are respectively configured as an integrator circuit. The respective switches SWr0, . . . , and SWm are arranged between the common input terminal and the resistive elements R0 R1, . . . , and Rn. The respective switches SWc0, . . . , and SWcn are arranged between the common input terminal and the capacitors C0, C1, . . . , and Cn. The on-off state of the switches SWr0, SWc0 to SWrn and SWcn are controlled by a signal from the suppressing period storage 11 similarly to the suppressing period setter 18A; however, in this situation, it is necessary to provide up to a signal Tn+1.

Figure 4:
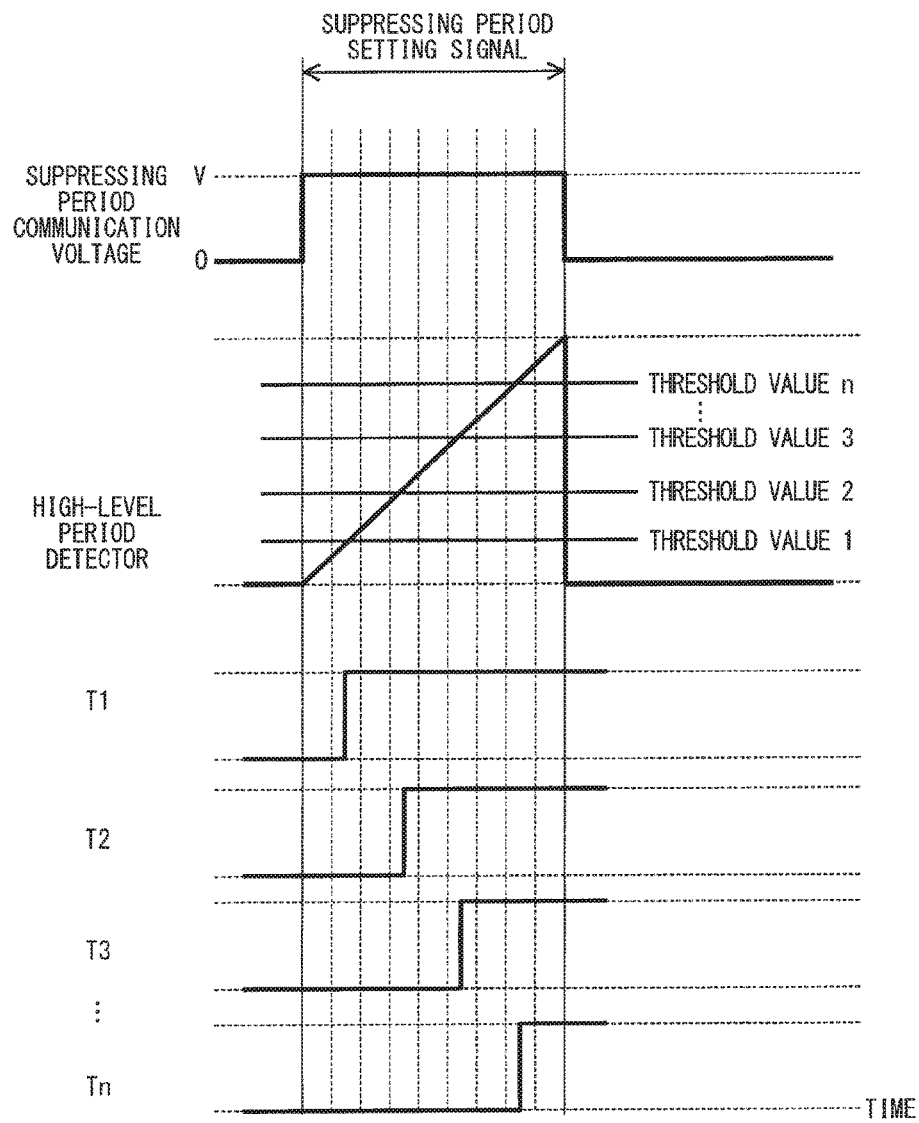
FIG. 4 illustrates an operation timing chart.

The following describes the operation of the present embodiment. As shown in FIG. 4, the suppressing period transmitter 9 transmits a suppressing period setting signal showing the length of suppressing period as a high-level period. Thus, the comparator 21 of the suppressing period detector 10 sets the output signal at the high-level during which the suppressing period setting signal is indicative of the high-level. Since the capacitor 26 is charged by the current source 24 during which the output signal of the comparator 21 is indicative of the high-level, the terminal voltage rises linearly.

The comparator 27 changes sequential output signals to the high-level from the one with lower set threshold value. The suppressing period storage 11 is configured by, for example, a latch circuit, and sets the output signals T1 . . . , of which the rising edge acts as a trigger, to be at the high-level.

According to the configuration of the suppressing period setter 18A shown in FIG. 5, when all of the switches are at the off-state, the integrator circuit is configured only by the resistive element R0 and capacitor C0, and the time constant is at the minimum value. From this situation, as the output signals T1, . . . , Tn are changed to the high-level sequentially, the switches SWr1, SWc1, . . . , SWm and SWcn are turned on sequentially, and the time constant increases gradually (see FIG. 6).

With regard to the suppressing period setter 18B illustrated at FIG. 7, only one of any combinations of switches SWr1 and SWc1, . . . , SWm and SWcn is exclusively turned on by the output signals T1, . . . , Tn+1. Accordingly, one of any integrator circuit R0 and C0, . . . , and the integrator circuit Rn and Cn is connected (see FIG. 8). In this situation, the time constants of the integrator circuit R0 and C0 . . . , and the integrator circuit Rn and Cn are set to be getting larger gradually.

When the transmission line 3 is driven by the communication node connected to the transmission line 3 and the differential signal is transmitted, since the FETs 12 and 14 are turned on in a situation where the differential signal level is at the high-level, the FET 13 is turned off. Accordingly, in the suppressing period setter 18, the FET 15 is turned on after the elapse of delayed time corresponding to the setting period stored in the suppressing period storage 11. Accordingly, the impedance gets lower as the high potential signal line 3P and the low potential signal line 3N are connected through the on-resistance of the FET 15. Therefore, the energy having waveform distortion generated in a falling edge period during which the differential signal level is changed to the low-level from the high-level is consumed by the on-resistance, and thus ringing is suppressed.

According to the present embodiment described above, when the suppressing period transmitter 9 transmits a setting signal indicative of the length of the suppressing period, the suppressing period detector 10 detects the suppressing period indicated by the setting signal, and the suppressing period storage 11 stores the length of the detected suppressing period. Subsequently, when the distortion suppressing start detector 5 detects a change in the level of the differential signal, the suppressing period controller 6 controls the FET 15 to turn on for only a suppressing period, which has the time length stored in the suppressing period storage 11.

According to the above configuration, the suppressing period controller 6 can variably change the period for turning on the FET 15 by determining the length of the suppressing period according to the communication speed of the differential signal and transmitting the setting signal from the suppressing period transmitter 9. Accordingly, the ringing suppression circuit 1 can optimally suppress ringing according to the applied communication speed.

In this situation, since the suppressing period transmitter 9 changes and transmits the continuation time of the high-level indicated by the setting signal according to the length of the suppressing period; and the suppressing period detector 10 detects the length of the continuation time, it is able to indicate the length of the suppressing period by a simple signal format.

The suppressing period detector 10 charges the capacitor 26 according to the length of the continuation time, and compares the terminal voltage of the capacitor 26 to the respective threshold values provided from the compactors 27_1 to 27_n, and detects the length of the continuation time according to the number of change in output signals provided from the comparators 27_1 ti 27_n, it is possible to detect the length of the continuation time by a simple hardware. Since the suppressing period storage 11 includes the latch circuit for storing changing statuses of the output signals from the respective comparators 27_1 to 27_n, it is possible for the latch circuit to store the length of the suppressing period indicated as the length of the continuation time.

In addition, the suppressing period setter 18 includes an integrator circuit that is able to change the time constant. When the suppressing period setter 18 changes the time constant according to the length of the suppressing period stored in the suppressing period storage 11, the suppressing period controller turns on the FET 15 according to the time constant. Accordingly, the length of the suppressing period can be adjusted by a simple configuration.

(Second Embodiment)

Figure 11:
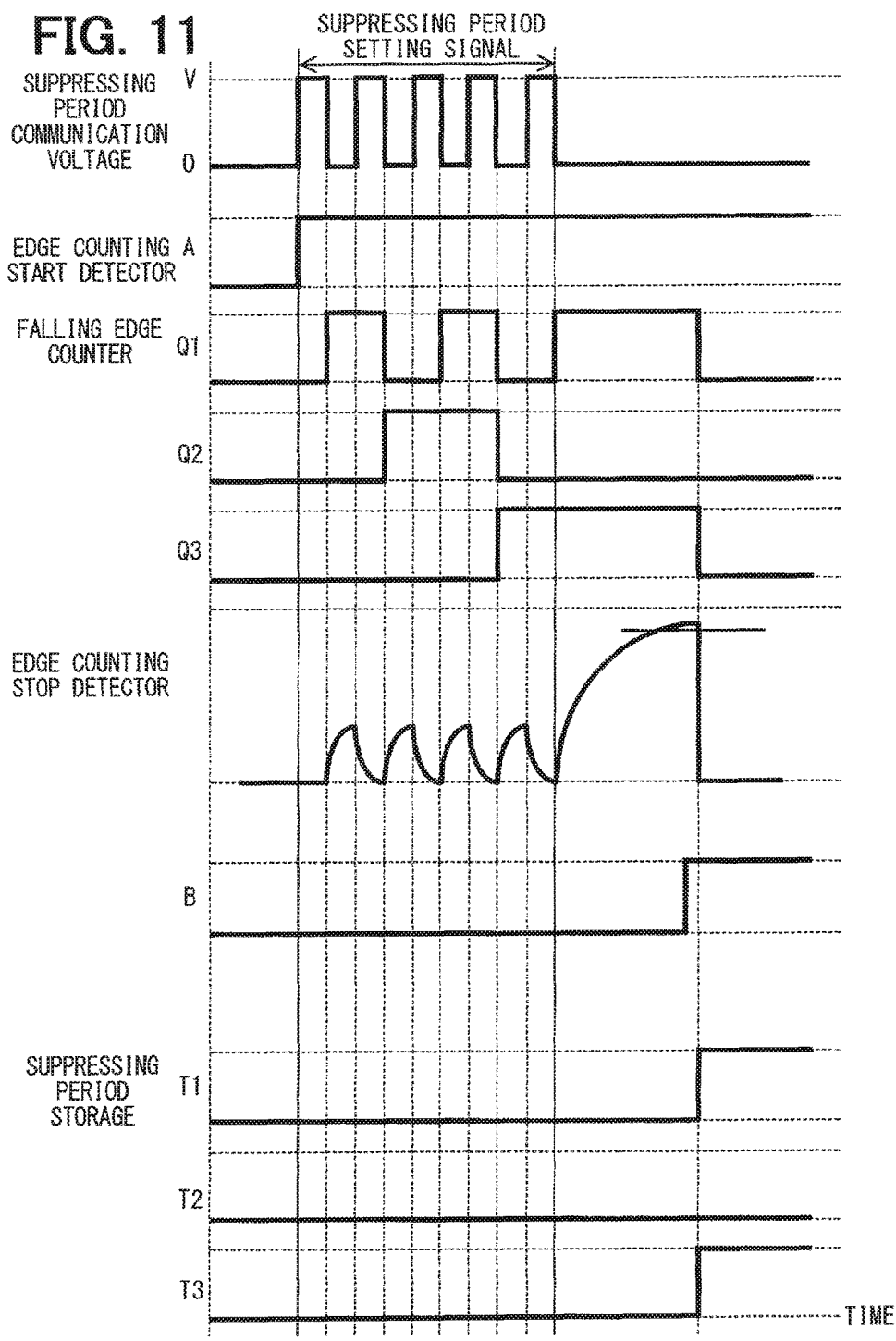
FIG. 11 illustrates an operational timing chart.

The following omits the description of the parts, which are appended by the same reference numerals, similar to the ones described in the first embodiment. In the second embodiment, the format of a setting signal indicative of the length of a suppressing period is different from the one described in the first embodiment. That is, as shown in FIG. 11, the length of the suppressing period is indicated by the number of a change in the level of the setting signal between a high level and a low level.

Figure 9:
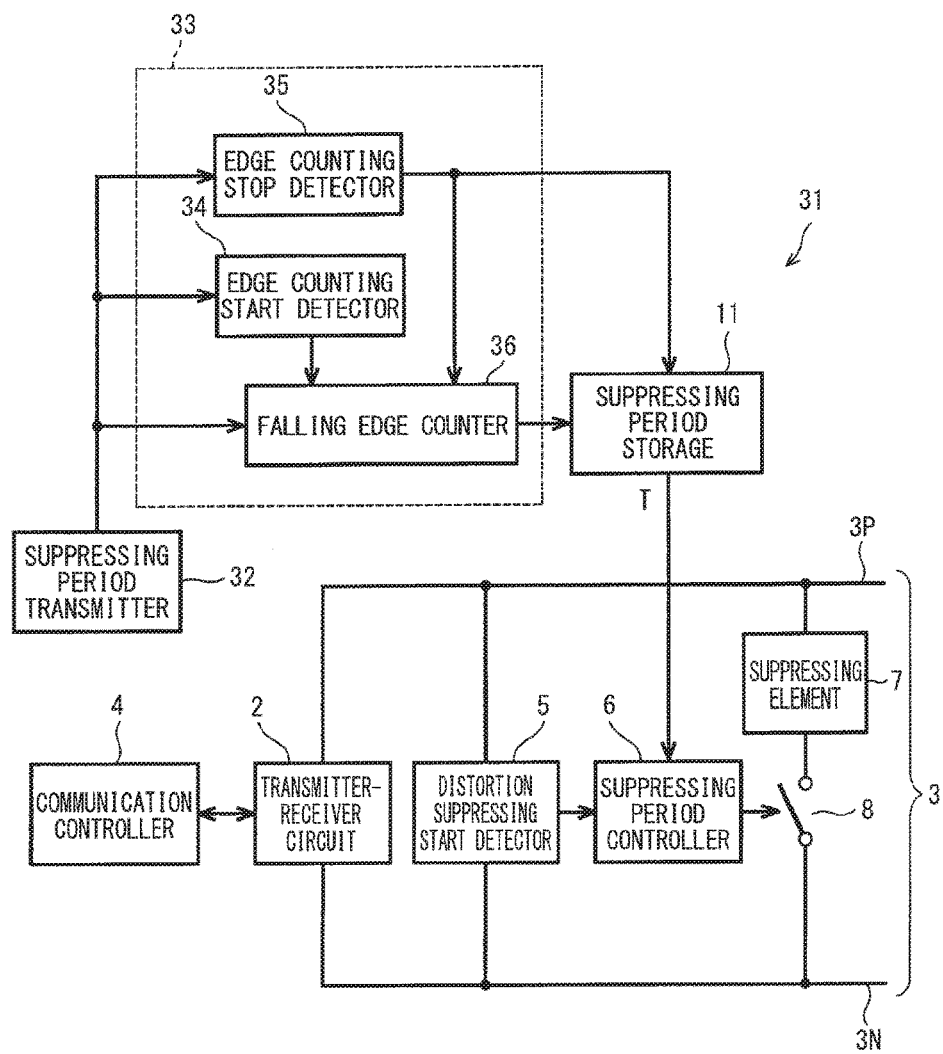
FIG. 9 illustrates a functional block diagram that shows a configuration of a ringing suppression circuit according to a second embodiment.

As shown in FIG. 9, a ringing suppression circuit 31 according to the second embodiment includes a suppressing period transmitter 32 and a suppressing period detector 33 in replacement of the suppressing period transmitter 9 and the suppressing period detector 10. The suppressing period detector 33 includes an edge counting start detector 34, an edge counting stop detector 35 and a falling edge counter 36.

Figure 10:
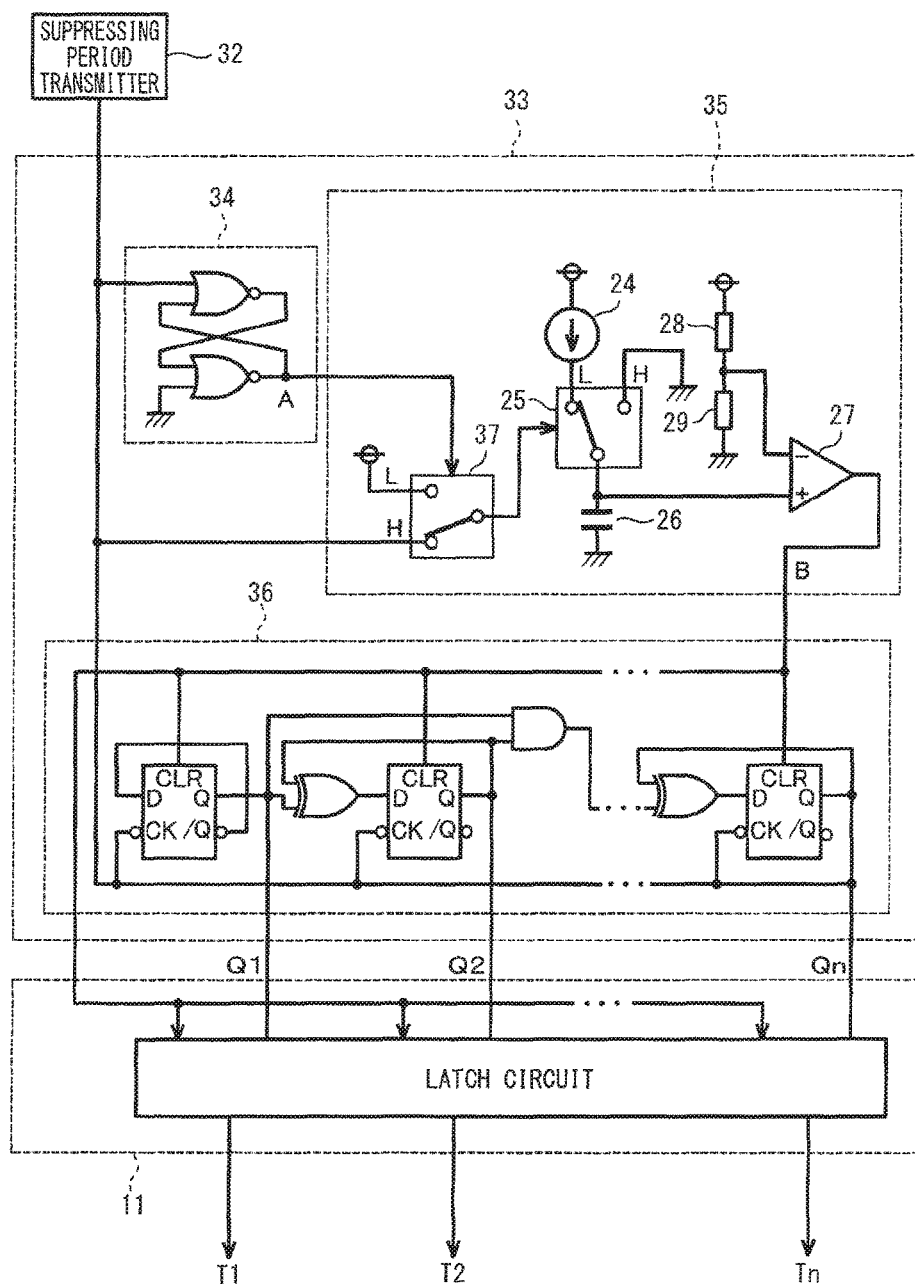
FIG. 10 illustrates a configuration related to a suppressing period detector and a configuration related to a suppressing period storage in detail.

As shown in FIG. 10, the edge counting start detector 34 is configured by the latch circuit. The edge counting stop detector 35 includes the charger and capacitor 26 described in the first embodiment and one comparator 27. However, the current source 24 is connected to the L-side input terminal of the selector 25, and the H-side input terminal of the selector 25 is connected to the ground.

In addition, the edge counting stop detector 35 includes one selector 37. The H-side input terminal of the selector 37 is connected to the output terminal of the suppressing period transmitter 32, and the L-side input terminal is pulled up to the power source. The input selection of the selector 37 is carried out by the output signal from the edge counting start detector 34, and the input selection of the selector 25 is carded out by the output signal of the selector 37.

The falling edge counter 36 is configured by an n-bit counter, and the counting value is latched by the latch circuit of the suppressing period storage 11. The counter is cleared when the output signal from the comparator 27 is at the high level, and the latch circuit latches the input date at the rising edge of the output signal.

Figure 12:
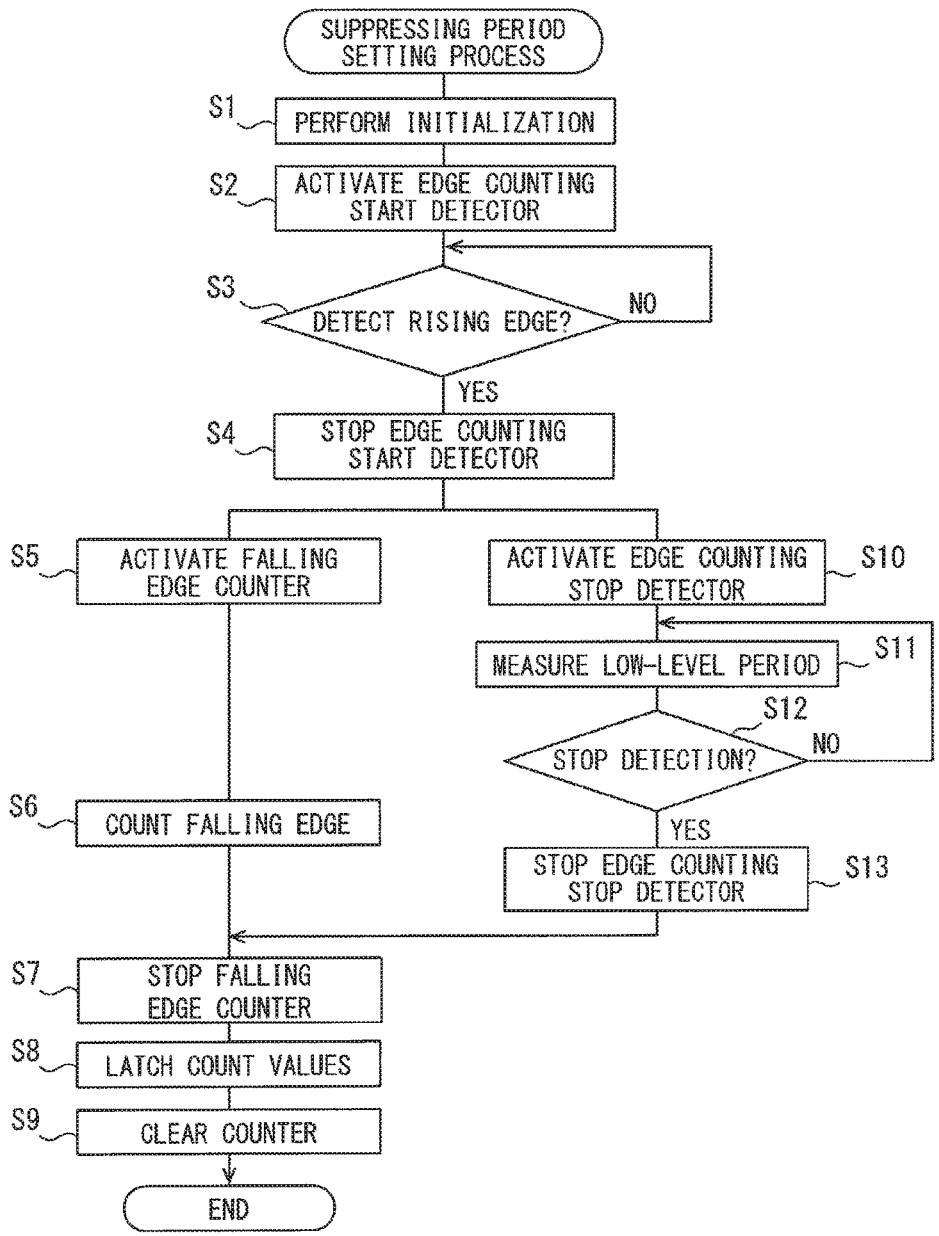
FIG. 12 illustrates a flowchart of a circuit operation.

The following describes the operation in the second embodiment. As shown in FIG. 11, in the initial state, the suppressing period transmitter 32 maintains the level of the output signal at the low level (FIG. 12; S1). Since the output signal A from the edge counting start detector 34 is at the low level, the output level of the selector 37 is switched to the high level and the selector 25 controls the capacitor 26 to discharge electricity. Accordingly, the output signal B from the comparator 27 is switched to the low level. Because of this situation, the suppressing period transmitter 32 transmits the setting signal based on the number of change in the output signal according to the binary level related to the high/low level.

When the output signal of the suppressing period transmitter 32 is initially changed to the high level, the output signal A is switched to the high level (S2, S3; YES), and the situation is fixed hereinafter (S4). Since the selector 37 selects the H-side input terminal, the capacitor 26 is charged. Herein, the suppressing period transmitter 32 outputs 5 times the high-level pulse as the setting signal. In this situation, since the selector 25 charges the capacitor 26 each time when the setting signal indicates the high level, the signal B is maintained at the low level during which the level of the setting signal is changed within the certain period (S10 to S12).

The counter in the falling edge counter 36 performs a counting operation through the falling edge of the setting signal (S5, S6). In FIG. 11, only 3 bits (Q1 to Q3) are indicated. Subsequently, when the situation of the low level still continues after the transmission of the setting signal is completed (S7), the charging of the capacitor 26 continues and the terminal voltage rises. When the signal B is switched to the high level in a situation where the terminal voltage exceeds the threshold voltage of the comparator 27 (S12; YES), the latch circuit in the suppressing period storage 11 latches the counting value "5" (S8), and the counter in the falling edge counter 36 is cleared (S9).

According to the second embodiment described above, the suppressing period transmitter 32 changes the output number of which the switching of edge of the setting signal is carried out between the binary levels according to the length of the suppressing period. The suppressing period detector 33 detects the number of the output. Accordingly, the setting signal can be transmitted with the improved noise resistance. In this situation, since the suppressing period detector 33 counts the output number through the falling edge counter 36, the length of the suppressing period, which is indicated by the setting signal, can be easily detected by the counting value.

(Third Embodiment)

Figure 13:
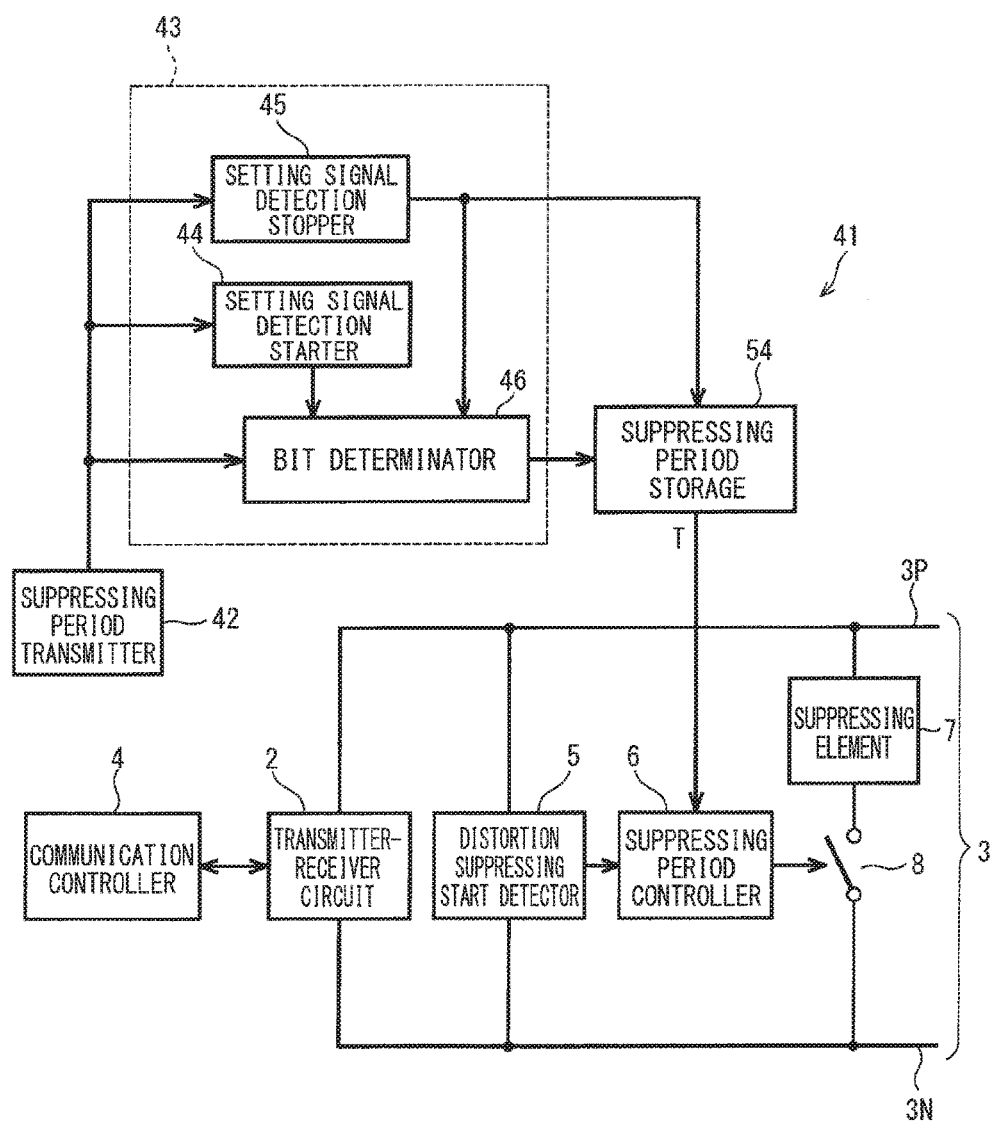
FIG. 13 illustrates a functional block diagram that shows a configuration of a ringing suppression circuit according to a third embodiment.
Figure 15:
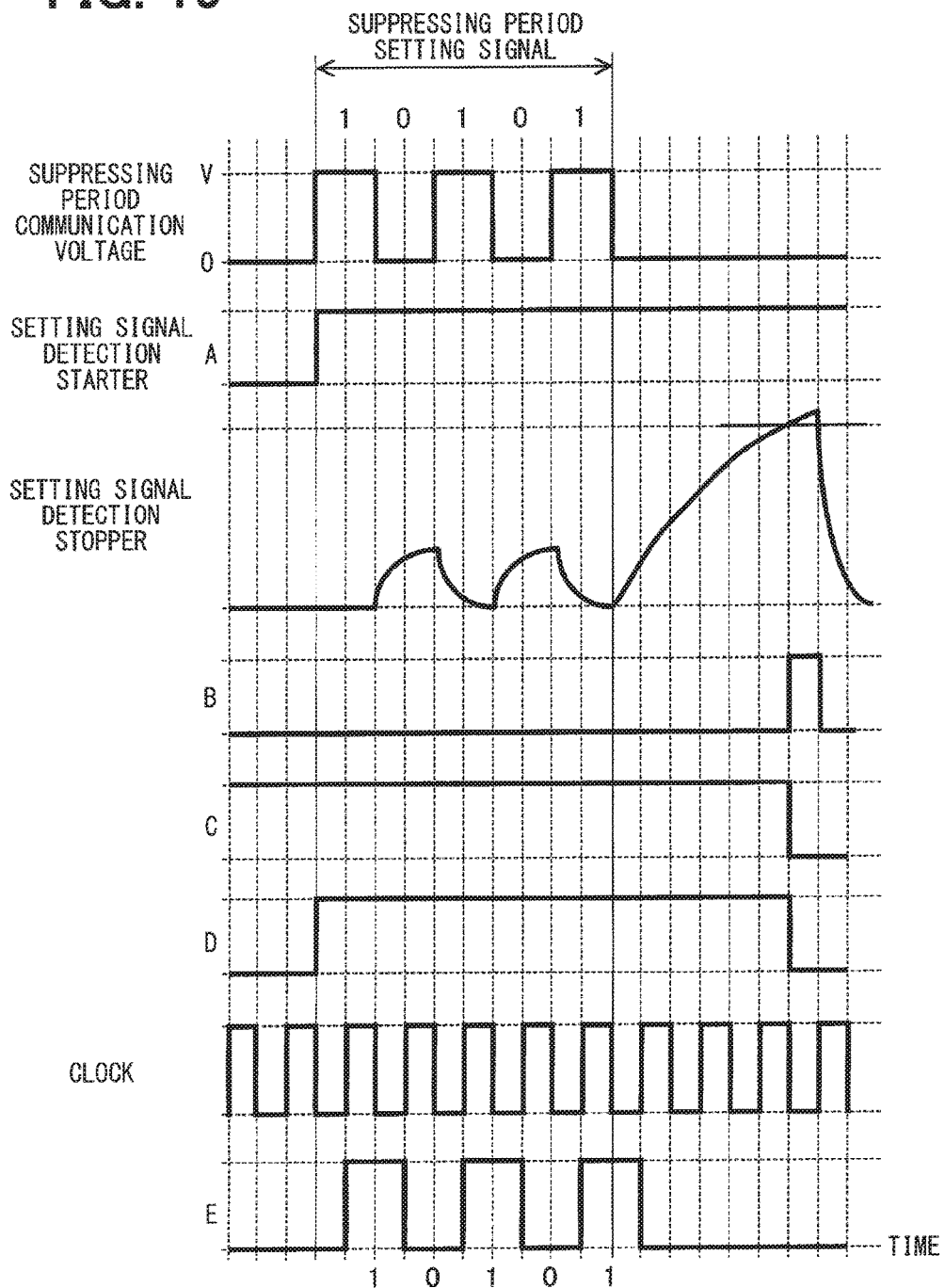
FIG. 15 illustrates an operational timing chart.

A third embodiment is different from the first and second embodiments in a format of a setting signal indicative of the length of a suppressing period. As illustrated in FIG. 15, the length of the suppressing period is indicated by a digital signal related to an NRZ signal. As illustrated in FIG. 13, a ringing suppression circuit 41 according to the third embodiment includes a suppressing period transmitter 42 and a suppressing period detector 43, which respectively replace the suppressing period transmitter 9 and the suppressing period detector 10. A suppressing period detector 43 includes a setting signal detection starter 44 and a setting signal detection stopper 45 and a bit determinator 46.

Figure 14:
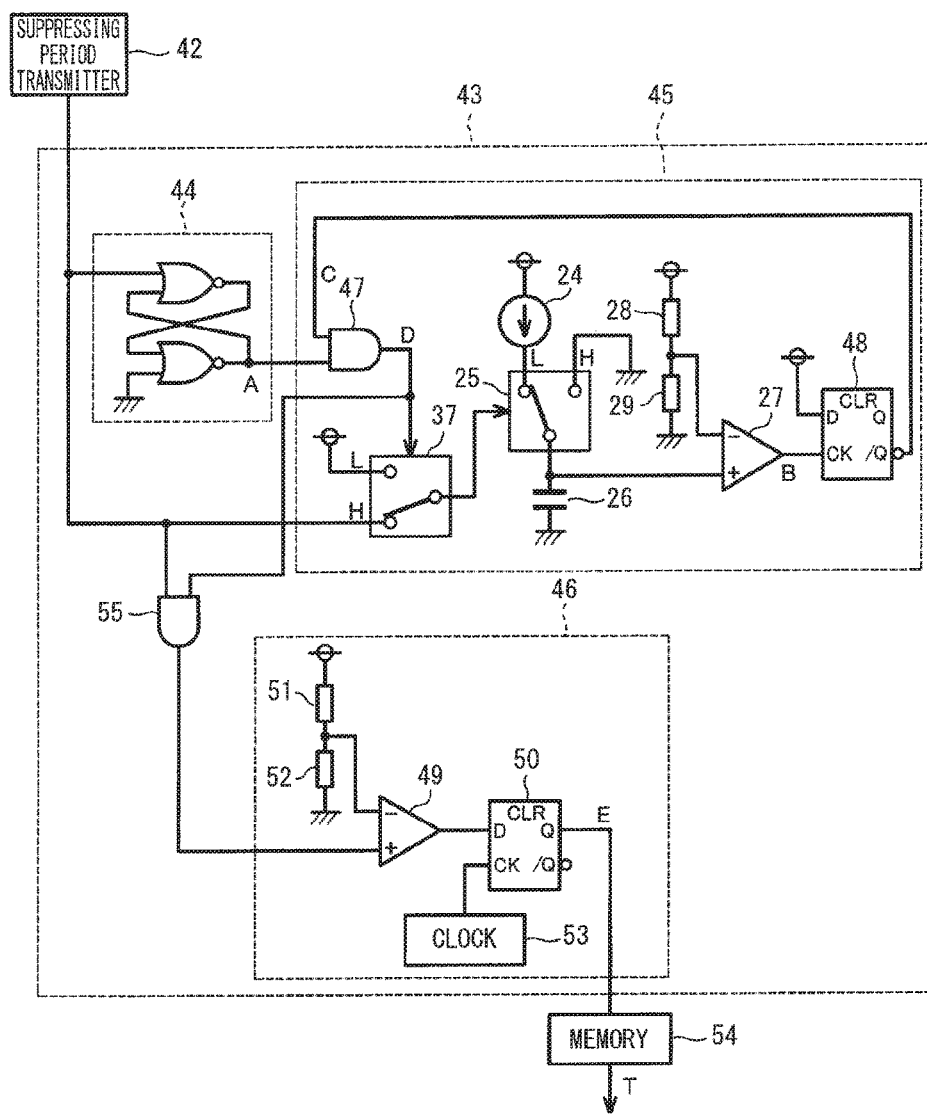
FIG. 14 illustrates a configuration related to a suppressing period detector and a configuration related to a suppressing period storage in detail.

As illustrated in FIG. 14, the setting signal detection starter 44 is configuration by the latch circuit similar to the one in the edge counting start detector 34. The setting signal detection stopper 45 further includes an AND gate 47 and a D-flip flop 48 in addition to the edge counting stop detector 35 described in the second embodiment. The output signal A from the latch circuit is sent to the selector as a signal D through the AND gate 47. The output signal B from the comparator 27 is sent to a clock terminal of the D-flip flop 48. The Q-bar output terminal of the D-flip flop 48 sends a signal C to the input terminal of the AND gate 47. The input terminal D of the D-flip flop 48 is pulled up to the power source.

The bit determinator 46 includes a comparator 49 and a D-flip flop 50. The non-inverting input terminal of the comparator 49 is connected to the output terminal of the AND gate 55. The input terminals of the AND gate 55 are respectively connected to the output terminal of the suppressing period transmitter 42 and the output terminal of the AND gate 47. A threshold value, which is obtained by dividing a power source voltage through the resistive elements 51 and 52, is sent to the inverting input terminal of the comparator 49. The output terminal of the comparator 49 is connected to the input terminal D of the D-flip flop 50. A dock signal, which is generated by a clock oscillation circuit 53, is sent to the clock terminal CK of the D-flip flop 50. In addition, the suppressing period storage 54 according to the third embodiment is configured by, for example, a memory, and a signal E (data) from the output terminal Q of the D-flip flop 48 is stored in the memory.

Figure 16:
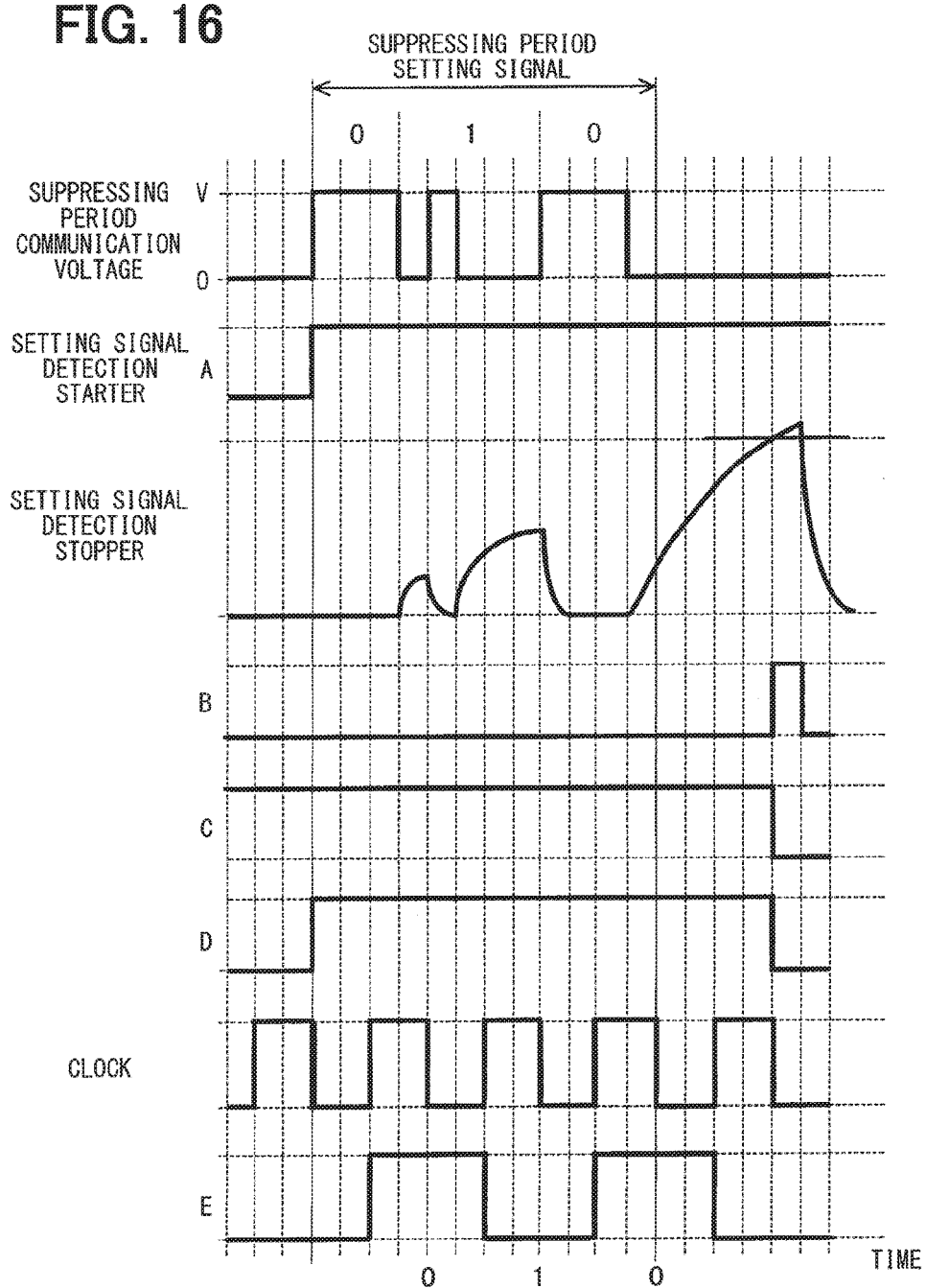
FIG. 16 illustrates an operational timing chart according to a fourth embodiment.

The following describes the operation in the third embodiment. As illustrated in FIG. 16, at the initial state, the suppressing period transmitter 42 maintains the level of the output signal at the low level. It is noted that the output signal C of the D-flip flop 48 is at the high level as the initial state. Similar to the second embodiment, the output signal from the selector 37 is switched to the high level and the selector 25 controls the capacitor 26 to discharge electricity when the output signal A from the setting signal detection starter 44 is at the low level. Accordingly, the output signal B from the comparator 27 is at the low level. In addition, since the signal D is at the low level, the output signal from the AND gate 55 is also at the low level; and the signal E is also at the low level.

From this situation, when the suppressing period transmitter 42 changes the output signal to the high level, the output signal A is switched to the high level and then is fixed to this situation hereinafter. Accordingly, when the selector 37 selects the H-side input terminal, the capacitor 26 is charged. Herein, the suppressing period transmitter 42 transmits 5-bit date "10101" as the setting signal. At this time, as similar to the second embodiment, since the selector 25 charges the capacitor 26 each time when the setting signal indicates the high level, the signal B remains at the low level during which the level of the setting signal changes within a certain period. It is noted that the data transmitting period sets to two divisions of the dock signal period in the bit determinator 44.

When the signal A is switched to the high level, the signal D is also switched to the high level. A setting signal is sent to the input terminal D of the D-flip flop 50 through the AND gate 55. Thus, the D-flip flop is triggered by a change in the level according to the data "10101". Accordingly, the data E also indicates the serial data "10101".

Subsequently, when the transmission of the setting signal is completed and the low level has been continued, the charging of the capacitor 26 continues and the terminal voltage rises, as similar to the second embodiment. As the terminal voltage exceeds the threshold voltage of the comparator 27, the signal B is switched to the high level and the D-flip flop 48 is triggered. Thus, the signal C is switched to the low level, and the signal D is also switched to the low level.

Herein, the storage of data performed by the suppressing period storage 54 may shift the serial data, which is input by, for example, a shift register, through a clock signal. Subsequently, as similar to the first embodiment, the time constant may be adjusted by decoding the data stored in the suppressing period storage 54 through a decoder.

According to the third embodiment as described above, the suppressing period transmitter 42 digitalizes the length of the suppressing period in the setting signal by the NRZ signal in a predetermined format and then transmits the data, and the suppressing period detector 43 detects the data value. Accordingly, it is not needed to elongate the transmission period of the setting signal according to situation of setting the suppressing period to be longer.

(Fourth Embodiment)

A fourth embodiment utilizes the ringing suppression circuit 41 according to the third embodiment to indicate the setting signal in a case of transmitting in a PWM signal format. As illustrated in FIG. 16, for example, the duty ratio 75% is set as data "0", and the duty ratio 25% is set as data "1". Subsequently, the PWM period is matched to the clock signal period of the dock oscillation circuit 53, and the setting signal is transmitted at the timing when the rising edge of the clock signal corresponds to the center phase of a PWD period. Thus, the signal E indicates that the duty ratio 100% corresponds to data "0" and the duty ratio 0% corresponds to data "1".

According to the fourth embodiment configured as described above, the setting signal can be transmitted in the PWM signal format.

(Fifth Embodiment)

Figure 17:
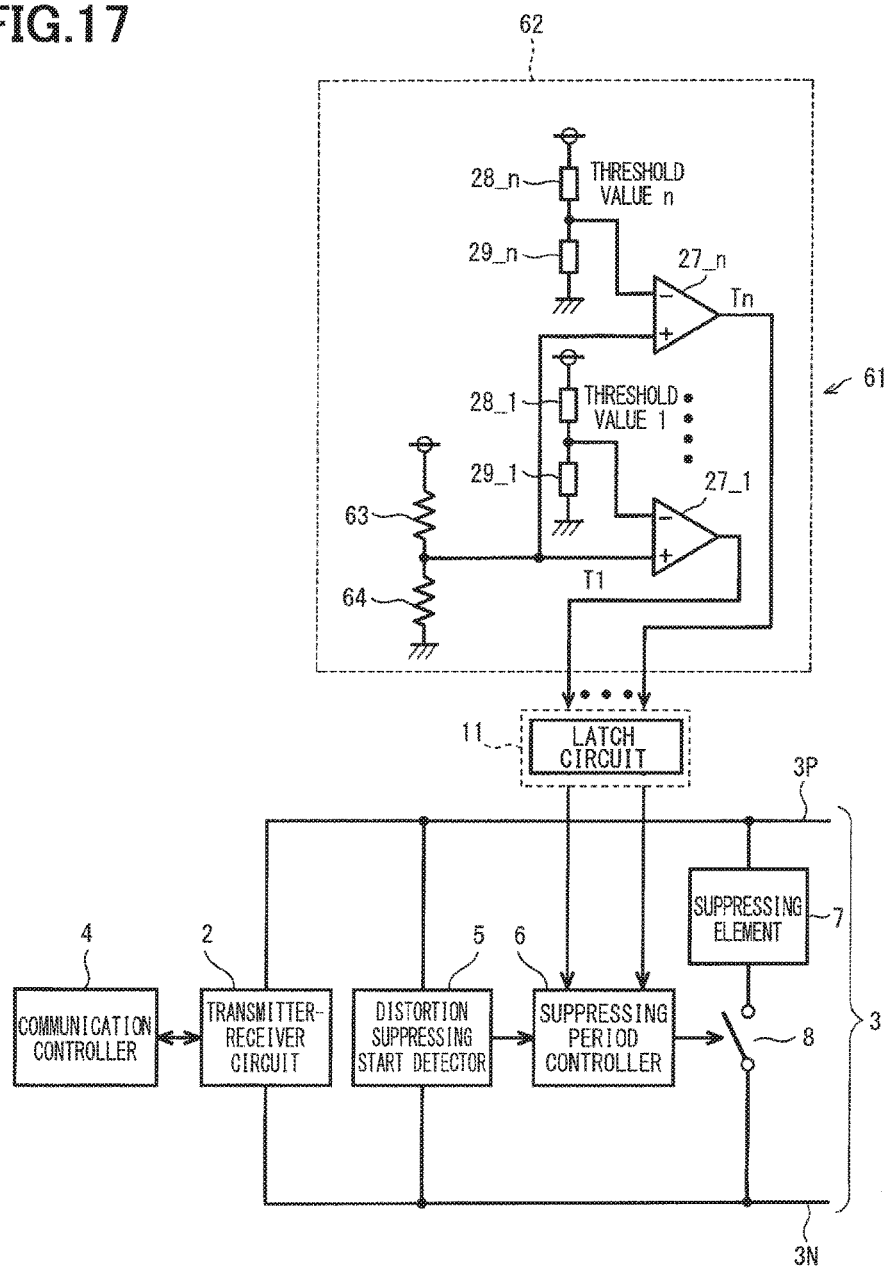
FIG. 17 illustrates a functional block diagram showing a configuration of a ringing suppression circuit according to a fifth embodiment.

As shown in FIG. 17, a ringing suppression circuit 61 according to the fifth embodiment does not include, for example, the suppressing period transmitter 9 according to the first, second, third and fourth embodiments, the common connection point of resistive elements 63, 64, which are connected between the power source and ground, is connected to the input terminal of a suppressing period detector 62. In the fifth embodiment, the length of the suppressing period is set according to the voltage level set by the setting signal.

The fifth embodiment configured as described above does not include, for example, the suppressing period transmitter 9 as described in the first, second, third and fourth embodiments. The fifth embodiment can send a setting signal according to the voltage level, which is obtained by dividing the power source voltage.

Figure 18:
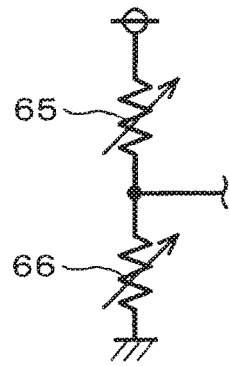
FIG. 18 illustrates a modification example of a configuration for sending a setting signal (part 1)

For providing the above-mentioned setting signal with the voltage level, in replace of the resistive elements 63 and 64, as shown in, for example, FIG. 18, the voltage level can be changed by using a series circuit including variable resistive elements 65 and 66. It is noted that only one of the resistive elements 63 and 64 may be replaced by a variable resistive element.

Figure 19:
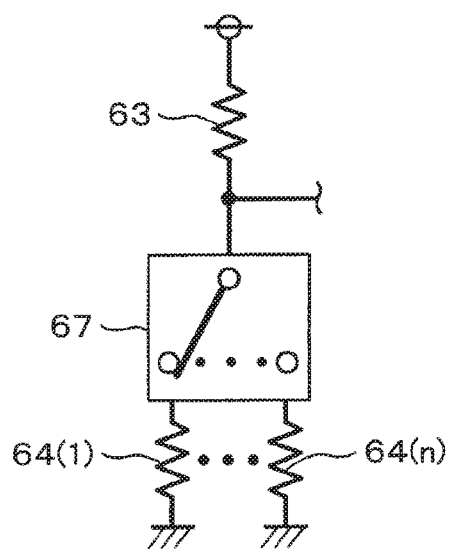
FIG. 19 illustrates a modification example of a configuration for sending a setting signal (part 2)

Similarly, for configuring the voltage level which can be varied, as shown in, for example, FIG. 19, the selector 67 is connected to the lower terminal of the resistive element 63, and the connection of the selector 67 to resistive elements 64(1) . . . 64(n) with different respective resistance value may be switched over.

Figure 20:
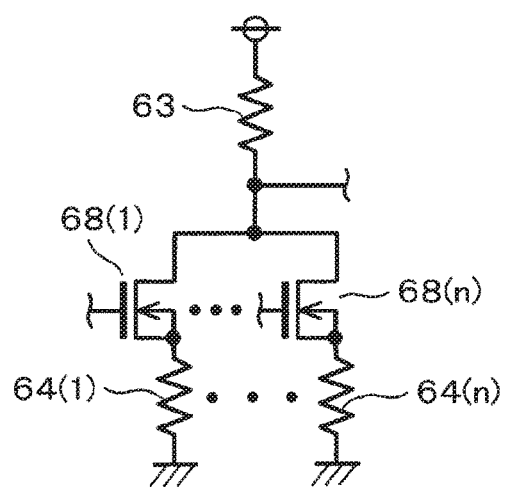
FIG. 20 illustrates a modification example of a configuration for sending a setting signal (part 3)

Moreover, as shown in, for example, FIG. 20, the selector 67 may be replaced by n N-channel MOSFETs 68(1) . . . 68(n) so that the voltage level can also be changed by selectively turning on one or more N-channel MOSFETs. In this situation, the resistance values of the resistive elements 64(1) . . . 64(n) may be all the same. In addition, for example, an NPN transistor or an analog switch may be used instead of the N-channel MOSFET 68.

(Sixth Embodiment)

Figure 21:
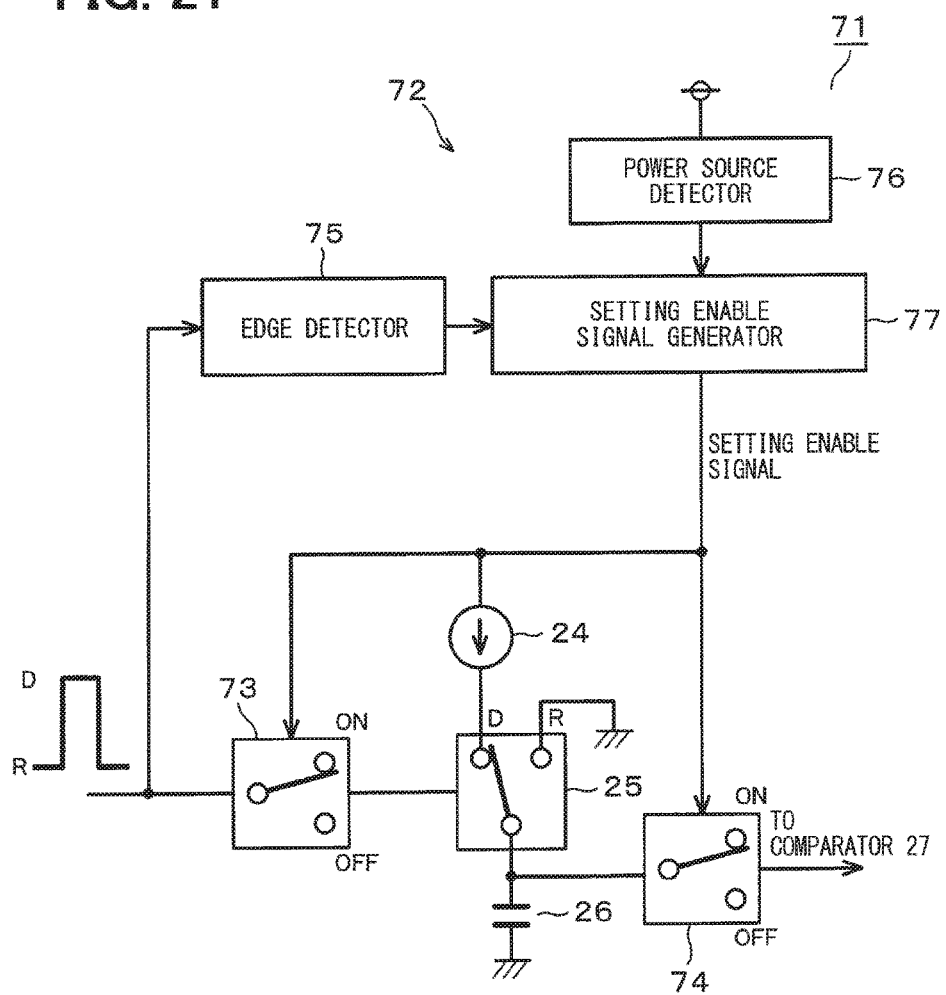
FIG. 21 illustrates a functional block diagram that shows a configuration of a ringing suppression circuit according to a sixth embodiment.

As illustrated in FIG. 21, in the sixth embodiment, the setting signal as a pulse signal is inputted to a suppressing period detector 72 in a ringing suppression circuit 71. Subsequently, the length of the suppressing period is indicated by the pulse width of the signal. In the suppressing period detector 72, the comparator 21 in the suppressing period detector 10 according to the first embodiment is replaced by the selector 73, and the selector 74 is inserted between the upper terminal of the capacitor 26 and the comparator 27. In addition, the suppressing period detector 72 includes an edge detector 75, power source detector 76 and a setting enable signal generator 77.

The power source detector 76 outputs an on-state trigger signal to the setting enable signal generator 77 when it is detected that a power source is inputted into the ringing suppression circuit 71. The edge detector 75 is configured by, for example, a flip flop, and outputs an off-state trigger signal to the setting enable signal generator 77 when the falling edge of the inputted pulse signal is detected. The setting enable signal generator 77 sets the setting enable signal to the high-active level when the on-state trigger signal is inputted, and sets the setting enable signal to the low level when the off-state trigger signal is inputted. The switching control between the selectors 73 and 74 is performed by the setting enable signal.

In view of above, the power source detector 76 corresponds to a power source supply detector, and the setting enable signal generator 77 corresponds to an enable signal output device. In addition, the current source 24 and the capacitor 26 correspond to the voltage signal converter.

The following describes the operation in the sixth embodiment. In the initial state, the selector 25 is at the R-side, and the selectors 73 and 74 are at the OFF side. As illustrated in FIG. 22, when the power source is put into the ringing suppression circuit 71, the power source detector 76 outputs an on-state trigger signal, and the setting enable signal generator 77 sets the setting enable signal to the high level. Therefore, both of the selectors 73 and 74 are switched to the ON side.

In this situation, when a pulse signal is inputted into the selector 73, the selector 25 is switched to D-side for only a period corresponding to a pulse width in which the signal indicates the high level, and the capacitor 26 is charged by the current source 24. When the level of the pulse signal is changed from the high level to the low level, the edge detector 75 outputs the off-state trigger signal at the timing of falling edge. Thus, the setting enable signal generator 77 sets the setting enable signal at the low level. When the charging of the capacitor 26 stops and the selectors 73 and 74 are both switched to the OFF side, the terminal voltage of the capacitor 26 at this timing is output to the comparator 27.

In other words, in the suppressing period detector 72, the capacitor 26 is charged in a period during which the input pulse signal is at high level and in a period corresponding to the pulse width. Accordingly, the length of the suppressing period is set according to the terminal voltage of the capacitor 26. It is noted that, in FIG. 22, the input signal is indicated as a plurality of pulse trains; however, a signal pulse signal may be also be the setting signal. Moreover, the setting signal may be transmitted by the setting signal transmitter described in, for example, the first to fourth embodiments.

According to the sixth embodiment described above, the power source detector 76 outputs the on-state trigger signal when it is detected that the power source is put into the ringing suppression circuit 71, and the edge detector 75 outputs the off-state trigger signal when the falling edge of the setting signal, which indicates the length of the suppressing period as a pulse width, is detected. Subsequently, the setting enable signal generator 77 sets the setting enable signal at the high level when the on-state trigger signal is input, and sets the same setting enable signal at the low level when the off-state trigger signal is input. The current source 24 to the capacitor 26 converts the input setting signal in a period during which the setting enable signal is at the active level to the voltage signal having a level corresponding to the pulse width. Accordingly, the setting of the suppressing period can be performed within a short time.

The present disclosure is not only limited to the above descriptions or the embodiments illustrated in the drawings, but may also be modified or enlarged as described in the following.

The setting signal transmitted by the setting signal transmitter may also be in a format indicating, for example, the length of the suppressing period by a voltage level obtained by the voltage division through resistance.

All of the configuration elements are not only limited to hardware, but may also be implemented by software.

The data "1, 0" may be defined reversely in the third and fourth embodiments. In addition, the duty ratio corresponding to the data value in the fourth embodiment may also be properly modified and defined.

The suppressing period setter may also include a timer.

The configuration of the suppressing period detector 72 in the sixth embodiment is one of examples. Any logic circuit may be used for converting to the voltage signal having a level corresponding to the pulse width of the setting signal.

It is noted that a flowchart or the processing of the flowchart in the present application includes sections (also referred to as steps), each of which is represented, for instance, as S1. Further, each section can be divided into several sub-sections while several sections can be combined into a single section. Furthermore, each of thus configured sections can be also referred to as a device, module, or means.

The invention claimed is:

1. A ringing suppression circuit connecting to a transmission line for transmitting a differential signal changed into a high level or a low level as one of binary levels through a pair of signal lines to suppress ringing occurred with a transmission of the differential signal, the ringing suppression circuit comprising:
   a single line switching element, which is driven by a voltage, that is connected between the pair of signal lines;
   a controller that detects a change in a level of the differential signal and turns on the single line switching element to lower an impedance between the pair of signal lines;
   a period detector that detects a length of a suppressing period indicated by a setting signal, which is an input; and
   a suppressing period storage that stores the length of the suppressing period which is detected by the period detector,
   wherein the pair of signal lines includes a high potential signal line and a low potential signal line,
   wherein the controller turns on the single line switching element for only the suppressing period having the length, which is stored in the suppressing period storage, and
   wherein the setting signal indicates the length of the suppressing period as a voltage level.

2. The ringing suppression circuit according to claim 1, wherein the voltage level is obtained by dividing a power source voltage through a voltage division circuit, which includes a plurality of resistive elements.

3. The ringing suppression circuit according to claim 2, wherein one or more of the plurality of resistive elements is a variable resistive element.

4. The ringing suppression circuit according to claim 2, further comprising:
   a selector at the voltage division circuit,
   wherein the selector switches a conduction path at the plurality of resistive elements to change the voltage level.

5. The ringing suppression circuit according to claim 4, wherein the selector includes a semiconductor switching element, which is driven by a voltage.

6. A ringing suppression circuit connecting to a transmission line for transmitting a differential signal changed into a high level or a low level as one of binary levels through a pair of signal lines to suppress ringing occurred with a transmission of the differential signal, the ringing suppression circuit comprising:
   a single line switching element, which is driven by a voltage, that is connected between the pair of signal lines;
   a controller that detects a change in a level of the differential signal and turns on the single line switching element to lower an impedance between the pair of signal lines;
   a period detector that detects a length of a suppressing period indicated by a setting signal, which is an input; and
   a suppressing period storage that stores the length of the suppressing period which is detected by the period detector,
   wherein the pair of signal lines includes a high potential signal line and a low potential signal line,
   wherein the controller turns on the single line switching element for only the suppressing period having the length, which is stored in the suppressing period storage,
   wherein the setting signal indicates the length of the suppressing period as a pulse width, and
   wherein the period detector includes:
      a power source supply detector that detects a start of a power source supply;
      an edge detector that detects a falling edge of a pulse of the setting signal;
      an enable signal output device
         sets a setting enable signal to an active level with a detection of the start of the power source supply as a trigger, and sets the setting enable signal to an inactive level with a detection of the falling edge as a trigger; and a voltage signal converter that generates a voltage level according to a length of a period during which the setting enable signal is at the active level.

7. A ringing suppression circuit connecting to a transmission line for transmitting a differential signal changed into a high level or a low level as one of binary levels through a pair of signal lines to suppress ringing occurred with a transmission of the differential signal, the ringing suppression circuit comprising:

a single line switching element, which is driven by a voltage, that is connected between the pair of signal lines;

a controller that detects a change in a level of the differential signal and turns on the single line switching element to lower an impedance between the pair of signal lines;

a period detector that detects a length of a suppressing period indicated by a setting signal, which is an input;

a suppressing period storage that stores the length of the suppressing period which is detected by the period detector; and a setting signal transmitter that transmits the setting signal to the period detector, wherein the pair of signal lines includes a high potential signal line and a low potential signal line, wherein the controller turns on the single line switching element for only the suppressing period having the length, which is stored in the suppressing period storage, wherein the setting signal transmitter changes a time length, during which a high level or a low level indicated by the setting signal is continued, according to the length of the suppressing period, and transmits the time length, wherein the period detector further includes:
 a charger that charges a capacitor according to the time length; and
 a plurality of comparators that compare a terminal voltage of the capacitor to different threshold values, and wherein the time length is detected according to a number of changes in output signals from the plurality of comparators.

8. The ringing suppression circuit according to claim 7, wherein the suppressing period storage includes a latch circuit, which stores a changing state of the output signals from the plurality of comparators.

9. A ringing suppression circuit connecting to a transmission line for transmitting a differential signal changed into a high level or a low level as one of binary levels through a pair of signal lines to suppress ringing occurred with a transmission of the differential signal, the ringing suppression circuit comprising:

a single line switching element, which is driven by a voltage, that is connected between the pair of signal lines;

a controller that detects a change in a level of the differential signal and turns on the single line switching element to lower an impedance between the pair of signal lines;

a period detector that detects a length of a suppressing period indicated by a setting signal, which is an input; and a suppressing period storage that stores the length of the suppressing period which is detected by the period detector, wherein the pair of signal lines includes a high potential signal line and a low potential signal line, wherein the controller turns on the single line switching element for only the suppressing period having the length, which is stored in the suppressing period storage, wherein the setting signal transmitter that changes an output frequency of an edge, which occurs when the setting signal is changed between binary levels, and wherein the period detector detects the output frequency.

10. The ringing suppression circuit according to claim 9, wherein the period detector further includes a counter, which counts a frequency of having a change in the setting signal.

11. The ringing suppression circuit according to claim 10, wherein the suppressing period storage includes a latch circuit, which latches a counting value of the counter, when a predetermined period, during which the output signals from the plurality of comparators remain unchanged, is elapsed.

* * * * *